(12) United States Patent
Cady et al.

(10) Patent No.: US 11,727,624 B2
(45) Date of Patent: Aug. 15, 2023

(54) CONSTRUCTION VISUALIZATION SYSTEMS AND METHODS

(71) Applicant: Hyperframe, Inc., Richmond, CA (US)

(72) Inventors: Jay Cady, San Francisco, CA (US); Kenneth Sobel, San Francisco, CA (US)

(73) Assignee: HYPERFRAME, INC., Richmond, CA (US)

( * ) Notice: Subject to any disclaimer, the term of this patent is extended or adjusted under 35 U.S.C. 154(b) by 127 days.

(21) Appl. No.: 17/323,710

(22) Filed: May 18, 2021

(65) Prior Publication Data

US 2021/0358201 A1 Nov. 18, 2021

Related U.S. Application Data

(60) Provisional application No. 63/026,542, filed on May 18, 2020.

(51) Int. Cl.
*G06T 15/20* (2011.01)
*G06T 7/70* (2017.01)
*G06T 19/00* (2011.01)

(52) U.S. Cl.
CPC ........... *G06T 15/20* (2013.01); *G06T 7/70* (2017.01); *G06T 19/003* (2013.01); *G06T 2200/24* (2013.01); *G06T 2207/30204* (2013.01); *G06T 2210/12* (2013.01)

(58) Field of Classification Search
None
See application file for complete search history.

(56) References Cited

U.S. PATENT DOCUMENTS

| 11,073,902 B1* | 7/2021 | Rahimi ................ G06F 3/011 |
| 2004/0233223 A1* | 11/2004 | Schkolne ............ G06F 3/04845 |
| | | 348/E5.002 |
| 2014/0210856 A1 | 7/2014 | Finn et al. |

(Continued)

FOREIGN PATENT DOCUMENTS

EP 3244286 A1 11/2017

OTHER PUBLICATIONS

International Search Report and Written Opinion from the International Searching Authority, dated Aug. 25, 2021, 13 pages, for the corresponding International Patent Application PCT/US2021/032950.

(Continued)

*Primary Examiner* — Frank S Chen
(74) *Attorney, Agent, or Firm* — Polsinelli; Adam Daniels; Timothy Fontes

(57) ABSTRACT

A construction visualization device generates a digital model of a structure for construction in a physical space. Notably, the digital model includes at least one model marker and the physical space includes at least one physical marker. The device also determines a viewing orientation of the digital model for display relative to the physical space based on the at least one model marker and the at least one physical marker. In addition, the device identifies a model position of a model part that corresponds to a physical position of a physical part of the structure, and displays at least a portion of the digital model based on the viewing orientation to indicate the model position of the model part.

21 Claims, 10 Drawing Sheets

(56) References Cited

U.S. PATENT DOCUMENTS

2019/0347746 A1    11/2019  Duncan et al.
2020/0242797 A1*   7/2020   McPeters .................. G06T 7/74

OTHER PUBLICATIONS

Wang, Xiangyu, et al., "Integrating Augmented Reality with Building Information Modeling: Onsite construction process controlling for liquefied natural gas industry," Automation in Construction, vol. 40, Apr. 1, 2014, pp. 96-105.

Kan, Tai-Wei, et al., "Applying QR Code in Augmented Reality Applications," Proceedings of the 8th International Conference on Virtual Reality Continuum and its Applications in Industry, VRCAI '09, Jan. 1, 2009, pp. 253-257.

* cited by examiner

CONSTRUCTION VISUALIZATION SYSTEMS AND METHODS

CROSS-REFERENCE TO RELATED APPLICATIONS

This non-provisional utility application claims the benefit of provisional patent application No. 63/026,542 filed on May 18, 2020, which is hereby incorporated by reference to its entirety.

TECHNICAL FIELD

The present disclosure relates generally to construction, and more particularly to improved building model visualization systems that orient and display digital models relative to a physical space.

BACKGROUND

Conventional construction often involves extensive collaboration between architects, tradespeople, laborers, professionals, inspectors, and so on. For example, a number of people often work simultaneously at the same site during construction and on the same structure (e.g., framing, plumbing, heating/cooling, electrical, etc.). The nature of this extensive collaboration in combination with multiple people working at the same time presents challenges relating to efficiency, quality control, and the like. In fact, the cost of labor to build a given structure often contributes to a significant portion of the total construction costs.

In an effort to control costs, construction professionals increasingly use prefabricated components in early stages of construction. Prefabricated components typically have specific dimensions and specific installation positions and orientations. However, installing prefabricated components may be difficult during early construction because structural features (e.g., studs, walls, counters, etc.) for orienting, locating, and installing a prefabricated component may not be constructed. Accordingly, proper installation of prefabricated components during early construction demands scrutiny and careful consultation with building plans. But even with such scrutiny, installing prefabricated parts often proves challenging due to the absence of intuitive surrounding structures.

Moreover, referencing construction building plans to install any component is often a slow and tedious process. For example, understanding how 2D building plans represent a 3D structure can be difficult, which leads to installation errors. In order to properly install or construct any component, a builder needs to accurately understand the given component's installation position and orientation in the 2D building plan and translate its 2D position and orientation into the 3D physical space. However, referencing and translating construction building plans can be time consuming and is often error prone, leading to increased labor costs. Finally, discrepancies between building plans (e.g., ideal models) and real-world structures can result in design changes, onsite adjustments and plan revisions, which also leads to increased labor costs, installation errors, and delay. In sum, conventional construction presents a myriad of complex challenges. These challenges, in turn, present opportunities to develop and employ new technologies that reduce costs, improve collaboration, and ensure proper component installation.

SUMMARY

The present disclosure provides a number of examples that describe construction visualization techniques and operations for visualizing building models relative to a physical space, scanning physical parts, identifying corresponding digital parts, providing graphical navigation aids, and generally facilitating efficient construction of a given structure. In the context of the disclosed methods, devices, techniques, apparatus, systems, and so on, the terms "operable to," "configured to," and "capable of" used herein are interchangeable.

In a first set of illustrative examples, the construction visualization techniques are embodied by a method. The method includes operations for generating a digital model of a structure for construction in a physical space. Notably, the digital model includes at least one model marker, and the physical space including at least one physical marker. The method also includes operations for determining a viewing orientation of the digital model for display relative to the physical space based on the at least one model marker and the at least one physical marker; identifying a model position of a model part that corresponds to a physical position of a physical part of the structure; and displaying at least a portion of the digital model based on the viewing orientation to indicate the model position of the model part relative to the physical space.

In a second set of illustrative examples, an apparatus performs the disclosed construction visualization techniques. In the context of the second set of illustrative examples, the apparatus can include a device, a system, and/or combinations thereof. The apparatus comprises a processor configured to execute one or more processes, and memory configured to store a process executable by the processor. The process, when executed, is operable to generate a digital model of a structure for construction in a physical space. Notably, the digital model includes at least one model marker and the physical space including at least one physical marker. The apparatus further determines a viewing orientation of the digital model for display relative to the physical space based on the at least one model marker and the at least one physical marker; identifies a model position of a model part that corresponds to a physical position of a physical part of the structure; and displays at least a portion of the digital model based on the viewing orientation to indicate the model position of the model part relative to the physical space.

In a third set of illustrative examples, the disclosed construction visualization techniques are embodied in a non-transitory, computer-readable medium storing instructions encoded thereon. The instructions, when executed by one or more processors, cause the one or more processors to generate a digital model of a structure for construction in a physical space. The digital model includes at least one model marker, and the physical space including at least one physical marker. The instructions are further operable to determine a viewing orientation of the digital model for display relative to the physical space based on the at least one model marker and the at least one physical marker; identify a model position of a model part that corresponds to a physical position of a physical part of the structure; and display at least a portion of the digital model based on the viewing orientation to indicate the model position of the model part relative to the physical space.

The foregoing examples broadly outline various aspects, features, and technical advantages of examples according to the disclosure in order that the detailed description that follows may be better understood. It is further appreciated that the above operations described in the context of the illustrative example method, device, and computer-readable medium are not required and that one or more operations may be excluded and/or other additional operations discussed herein may be included. Additional features and advantages will be described hereinafter. The conception and specific examples illustrated and described herein may be readily utilized as a basis for modifying or designing other structures for carrying out the same purposes of the present disclosure. Such equivalent constructions do not depart from the spirit and scope of the appended claims.

BRIEF DESCRIPTION OF THE DRAWINGS

The examples herein may be better understood by referring to the following description in conjunction with the accompanying drawings in which like reference numbers indicate the same or functionally similar elements. Understanding that these drawings depict only exemplary examples of the disclosure and are not therefore to be considered to be limiting of its scope, the principles herein are described and explained with additional specificity and detail through the use of the accompanying drawings in which.

Features which are believed to be characteristic of the concepts disclosed herein, both as to their organization and method of operation, together with associated advantages will be better understood from the following description when considered in connection with the accompanying figures. Each of the figures is provided for the purpose of illustration and description only, and not as a definition of the limits of the claims.

DESCRIPTION

Overview.

In general, the construction visualization process discussed herein facilitates efficient construction at a construction site by for example, providing operations for scanning and detecting physical parts of a structure, and providing real-time graphical displays or views of digital models relative to a physical space. As disclosed in detail below, the construction visualization process can be configured to operate with any number of devices, computer software/media, apparatus, and/or systems including, but not limited to mobile devices, software instructions, tablets, Virtual Reality (VR) devices, Augmented Reality (AR) devices, Mixed Reality (MR) devices, and so on.

Description.

Various examples of the disclosure are discussed in detail below. While specific implementations are discussed, it should be understood that this is done for illustration purposes only. A person skilled in the relevant art will recognize that other components and configurations may be used without parting from the spirit and scope of the disclosure.

As used herein, the terms "building," "structure," and/or "construction site" may be used interchangeably and generally refer to a physical structure on real property such as residential or commercial properties.

Figure 1:
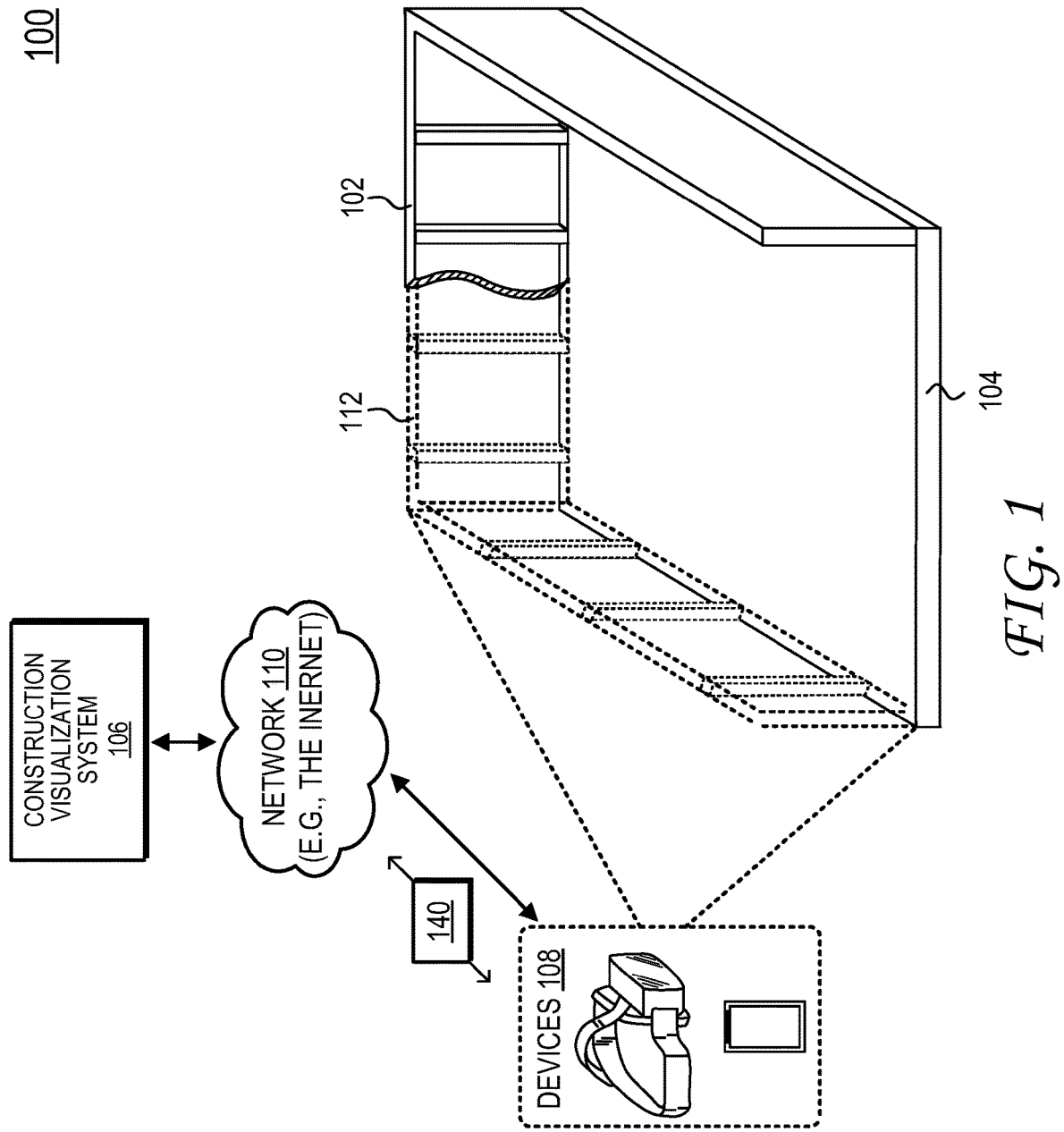
FIG. 1 illustrates a schematic diagram of an example construction site in accordance with one example of this disclosure.

FIG. 1 illustrates a schematic diagram of an example construction environment 100 in accordance with this disclosure. Construction environment 100 includes a structure 102 in a physical space or a construction site 104. Structure 102 is illustrated in a partially-finished state to show exposed physical parts such as framing components and wall studs. Construction environment 100 also includes a construction visualization system 106, which communicates with one or more devices 108 over a network 110.

Network 110 represents a communication network such as the Internet. Network 110 exchanges data, including data packets 140, between construction visualization system 106 and devices 108. Data packets 140 represent traffic or messages sent between networked devices/nodes.

Communication networks like network 110 are geographically distributed collections of devices or nodes interconnected by communication links and segments for transporting data there-between. Example communication networks include for example, local area networks (LANs) and wide area networks (WANs). LANs typically connect networked nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), synchronous digital hierarchy (SDH) links, etc. Network 110 is provided for purposes of illustration, not limitation. It is understood and appreciated that network 110 represents various types of communication networks for exchanging data packets 140 among networked devices using predefined network protocols such as certain wired protocols, wireless protocols (e.g., IEEE Std. 802.15.4, WiFi, Bluetooth®, etc.), PLC protocols, or other shared-media protocols where appropriate.

Devices 108 are also provided for purposes of discussion and illustration, not limitation. Devices 108 include a mobile device and a Mixed Reality device. However, it is also appreciated that devices 108 can also include any number of computing devices such as tablets, portable devices, computers, laptops, Virtual Reality (VR) devices, Augmented Reality (AR) devices, Mixed Reality (MR) devices, and so on.

Devices 108 exchanges data packets 140 with construction visualization system 106 over network 110 as part of a comprehensive construction visualization process. In general, devices 108 and/or construction visualization system 106 generate a digital model 112 of structure 102. Devices 108 further display digital model 112 (or portions thereof) at a viewing or display orientation relative to the physical space such that a user of devices 108 views digital model 112 as an overlay to the physical space.

Construction visualization system 106 is illustrated as a separate component/system from devices 108, however it is expressly contemplated that it may be configured to operate as an application that executes locally on devices 108. Optionally, it is also appreciated that construction visualization system 106 can host and execute the construction visualization processes of this disclosure, and provide data over network 110 for display by devices 108. Accordingly, it will be understood that the various disclosed construction visualization processes and techniques can be performed by devices 108, construction visualization system 106, and/or combinations thereof. In other words, the construction visualization techniques herein may be described in the context of a specific device or system, but it is appreciated and understood that such operations may be performed by other systems or devices.

Digital model 112 represents an electronic or virtual model of structure 102. For example, digital model 112 can include a variety of virtual models such as a Computer Aided Drawing (CAD) model and/or a Building Information Model (BIM). Devices 108 are configured to display digital model 112 (or portions thereof) at a viewing orientation relative to the physical space or construction site 104 to facilitate efficient construction of structure 102. For example, as shown, devices 108 display digital model 112 as a graphical overlay aligned with the partially completed portions of structure 102.

Figure 2:
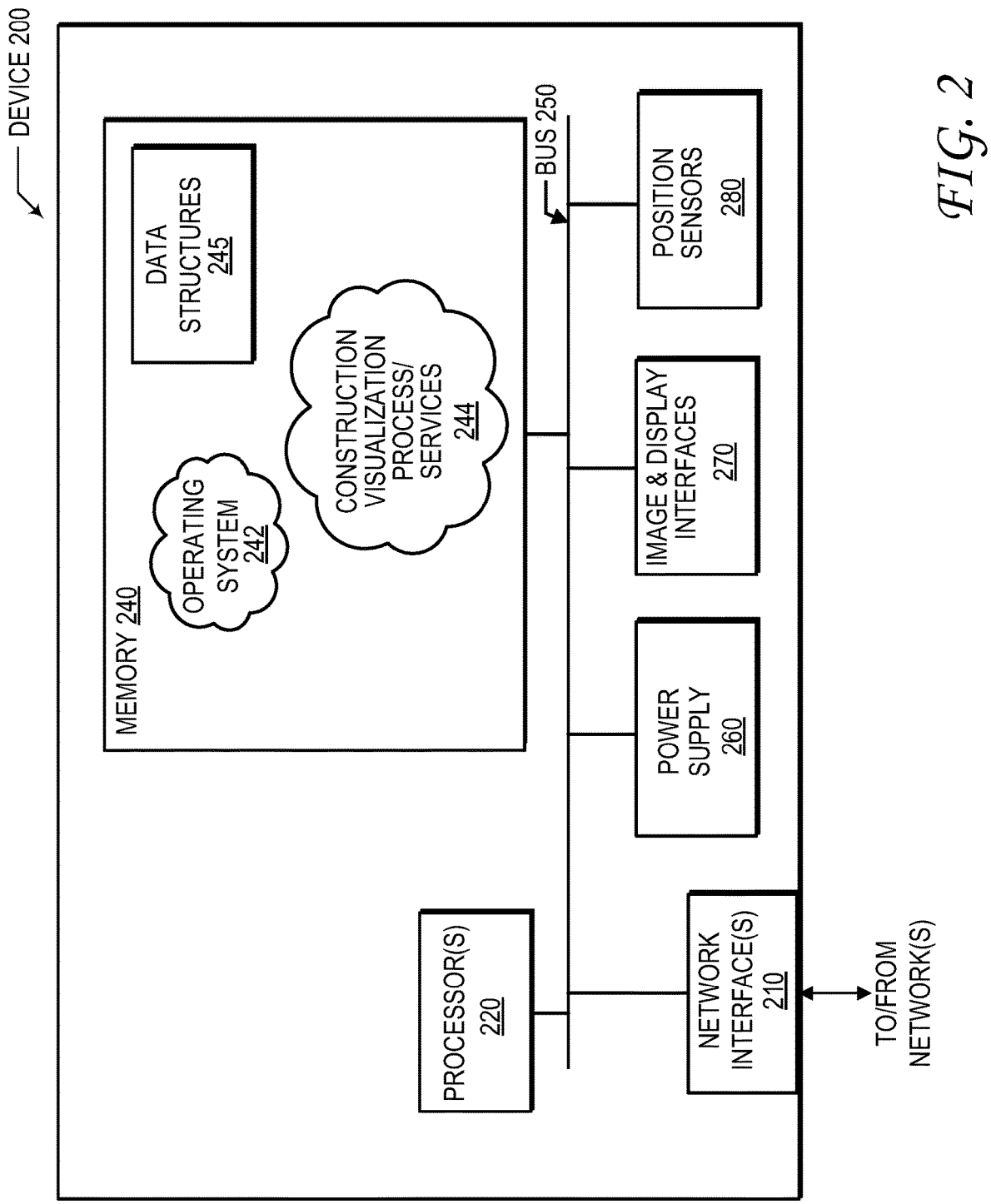
FIG. 2 illustrates a schematic diagram of an example device for facilitating construction visualization.

FIG. 2 illustrates a schematic diagram of an example device 200 that may be used with one or more examples described herein. For example, device 200 can represent one or more devices 108, construction visualization system 106, or component parts thereof. Device 200 comprises one or more network interfaces 210 (e.g., wired, wireless, PLC, etc.), at least one processor 220, a memory 240 interconnected by a system bus 250, a power supply 260 (e.g., battery, plug-in, etc.), image and display interfaces 270, and position sensors 280.

Network interface(s) 210 contain the mechanical, electrical, and signaling circuitry for communicating data over the communication links coupled to a communication network. Network interfaces 210 may be configured to transmit and/or receive data using a variety of different communication protocols. Network interfaces 210 are shown for simplicity, and it is appreciated that these interfaces may represent two different types of network connections, e.g., wireless and wired/physical connections. Also, while network interfaces 210 are shown separately from power supply 260, for programmable logic controllers (PLCs), the interface may communicate through power supply 260, or may be an integral component of the power supply. In addition, it is appreciated that network interfaces 210 can be compatible with Application Program Interface (API) specifications to communicate with a variety of other networked devices, systems, peripherals, etc.

Memory 240 comprises a plurality of storage locations that are addressable by processor 220 and network interfaces 210 for storing software programs and data structures associated with the examples described herein. Note that certain devices may have limited memory or no memory (e.g., no memory for storage other than for programs/processes operating on the device and associated caches).

Processor 220 comprises hardware elements or hardware logic adapted to execute the software programs (e.g., instructions) and manipulate data structures 245. An operating system 242, portions of which are typically resident in memory 240 and executed by the processor, functionally organizes device 200 by, inter alia, invoking operations in support of software processes and/or services executing on the device. These software processes and/or services includes a construction visualization process/services 244. Note that while construction visualization process/services 244 is shown in centralized memory 240, alternative or optional examples provide for these process/services to be configured for execution as part of a distributed computing network environment. In some examples, visualization process/services 244 can represent a mobile application that executes on local devices present at a construction site, while in other examples, the process/services can represent hosted applications accessible by local devices over a network.

Data structures 245 can include databases that store digital models, building plans (e.g., Building Information Models (BIMs), Computer Aided Drawing (CAD) models, etc.), floor plans, component lists, installation instructions, and relational structures, reference numbers, lookup tables, and so on.

Image and display interfaces 270 include hardware and software components that capture and display images, including videos. For example, image and display interfaces 270 include one or more image sensors or cameras that are configured to capture images and display components that are configured to display captured images. It is appreciated by those skilled in the art that the display components can include different configurations and types depending on the types of devices 108 (e.g., mobile devices, tablets, laptops, VR devices, AR, devices, MR devices, and so on). In operation, image and display interfaces 270 capture images of a physical environment (e.g., construction site 104) and display the images on an interface or display screen. In some examples, image and display interfaces 270 are configured to display images of a real physical space with an overlay view of holographic graphical elements of a digital model (e.g., digital model 112) to facilitate construction.

Position sensors 280 include hardware and software components that measure positions of device 200, including for example, coordinate positions, orientations, velocities, relative displacements, and/or accelerations. Position sensors 280 can include accelerometers, gyroscopes, global-positioning system (GPS) sensors, tilt sensors, or any other sensor configured to measure position and motion of device 200. In general, position sensors 280 help align and orient digital models for display relative to the physical environment.

It will be apparent to those skilled in the art that other processor and memory types, including various computer-readable media, may be used to store and execute program instructions pertaining to the techniques described herein. It will also be apparent to those skilled in the art that other processor and memory types, including various computer-readable media, may be used to store and execute program instructions pertaining to the techniques described herein. Also, while the drawings and corresponding description illustrate various aspects of the construction visualization process/services 244, it is expressly contemplated that the process/services may be embodied as separate modules and/or sub-routines within other processes.

As noted above, conventional construction presents a number of challenges due to the inherently complex and collaborative nature of building a structure. While construction professionals increasingly attempt to control costs by leveraging prefabricated components early in the construction process, such prefabricated components introduce additional challenges and require careful installation. For example, an installer for rough plumbing typically receives a bundle of pipes that are each precut to a specific length based on the installation location. Prefabricated product manufacturers often label each prefabricated pipe section according to a call out in a construction drawing. However, reading construction drawings, identifying corresponding components, and determining specific installation orientations is a difficult and time-consuming task that may require expertise in reading drawings. Moreover, revisions to the construction plans to accommodate and resolve discrepancies arising from real-world conditions can introduce ambiguity and complicate coordinating construction efforts.

Accordingly, the construction visualization processes and techniques herein provide a comprehensive solution that addresses the challenges presented by modern construction. For example, the construction visualization processes generate accurate digital models of a physical structure that account for real conditions or dimensions, display real-time images of a physical space, align orientation views of digital building models relative to a device displaying the real-time images, provide overlay graphical displays of component parts, and generate intuitive wayfinding interfaces that guide and facilitate component part installation in correct locations and orientations. These and other inventive features are described in greater detail herein.

Figure 3:
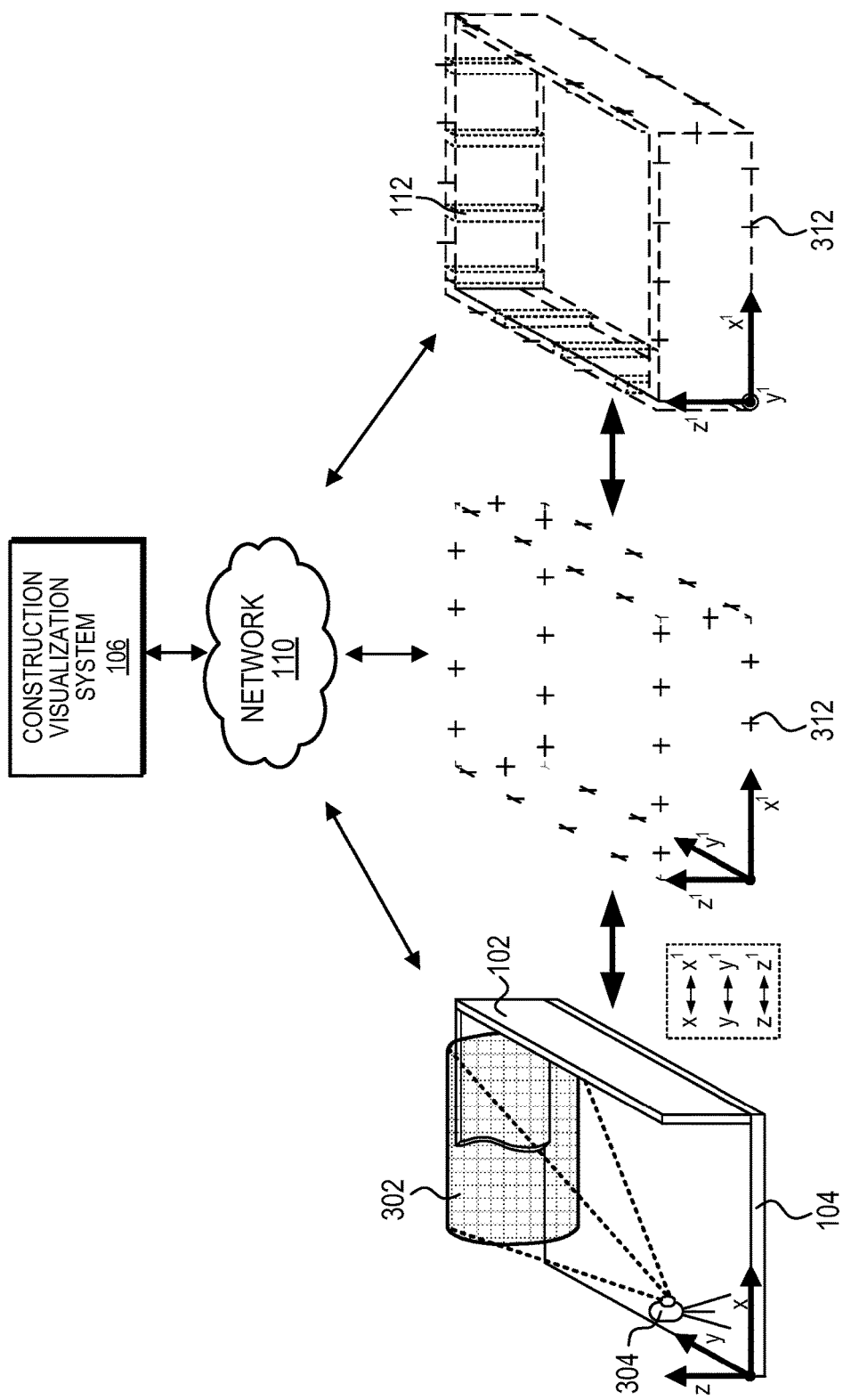
FIG. 3 illustrates a schematic diagram of a process performed by a construction visualization system to create a digital model of a structure.

FIG. 3 illustrates a schematic diagram 300 of a process performed by construction visualization system 106 to create digital model 112 and a point cloud 312. In the context of this disclosure, a point cloud represents a collection of coordinate points in a given coordinate system. Here, point cloud 312 represents coordinate points in a digital coordinate system that describe real dimensions of construction site 104. As illustrated, construction visualization system 106 orchestrates operations to scan construction site 104, generate point cloud 312, and create digital model 112. Optionally, as discussed, a local device (e.g., device 108) can be configured to locally execute processes and perform these operations.

In operation, construction visualization system 106 communicates with a laser scanner 304 positioned at construction site 104. Laser scanner 304 performs a scan 302 and captures data representing dimensions and characteristics of the physical space. Laser scanner 304 can include a steering mechanism (e.g., movable mirrors) that directs laser beams in multiple directions to scan and measure the dimensions of the physical space. Laser scanner 304 is also positioned to efficiently scan a large area of the physical space, and it can be repositioned to perform multiple scans in order to capture data representing all of the dimensions of the physical space (e.g., multiple rooms, multiple floors/levels, etc.). In some examples, laser scanner 304 also scans physical markers on construction site 104, which are discussed in greater detail below. Laser scanner 304 operably records time-of-flight data, measures distances, and computes dimensions of construction site 104. While laser scanner 304 efficiently and accurately measures the physical dimensions of the physical space, such dimensions can optionally be measured by one or more devices 108 (not shown) and/or manually measured.

In one example, laser scanner 304 generates point cloud 312. Optionally, in other examples, laser scanner 304 sends raw scan data to construction visualization system 106, and construction visualization system 106 generates point cloud 312 based on the raw scan data. Still further, laser scanner 304 can be optional and construction visualization system 106 may generate point cloud 312 based on manually measured dimensions of the physical space.

Point cloud 312 generally maps the real coordinate points of the physical space into corresponding digital coordinate points a digital coordinate system. In this fashion, point cloud 312 is a vehicle for translating digital coordinates to real coordinates and vice versa. For example, coordinate point positions and distances in one coordinate system represents corresponding positions and dimensions in the other coordinate system.

Real coordinates of the physical space are represented in a real coordinate system having "x," "y," and "z" axes, and corresponding digital coordinates of a corresponding digital space are represented by a digital coordinate system having "$x^1$," "$y^1$," and "$z^1$" axes. As discussed in greater detail below, the construction visualization process in this disclosure uses point cloud 312 to align real and digital coordinate systems and thus, align viewing orientations for displaying digital model 112 relative to the physical space.

Still referring to FIG. 3, construction visualization system 106 also generates digital model 112 of structure 102. Construction visualization system 106 further adjusts and/or builds digital model 112 in the digital coordinate system based on point cloud 312. For example, construction visualization system 106 can translate, rotate, scale, and/or re-dimension digital model 112 to fit or mesh with the collection of digital coordinate points that form point cloud 312. In some examples, construction visualization system 106 scan matches or point set registers ideal dimensions of digital model 112 to corresponding data points in point cloud 312. Construction visualization system 106 can apply global dimension changes to scale every component of digital model 112, or may optionally adjust specific component parts of digital model 112 to fit within boundaries defined by point cloud 312. In this way, construction visualization system 106 adjusts digital model 112 to fit the boundaries or dimensions defined by point cloud 312. In turn, these adjustments create an accurate digital model of the physical space or construction site 104 that accounts for discrepancies between ideal models and real structures. Accurate digital models help mitigate the need for on-site design changes, adjustments, and plan revisions.

Optionally, in some examples, construction visualization system 106 generates digital model 112 first, and then generates point cloud 312 based on the dimensions of digital model 112. In this fashion, point cloud 312 initially reflects or represents digital model 112. Construction visualization system 106 further adjusts point cloud 312 based on the real dimensions of the physical space, which in turn, adjusts the dimensions of digital model 112.

In sum, schematic diagram 300 illustrates operations for scanning a physical space, generating a point cloud representation the physical space in a digital coordinate system, mapping the digital coordinate system to a real coordinate system using the point cloud, and generating and/or adjusting a digital model based on a point cloud to accurately reflect the real dimensions of the physical space. As mentioned, construction visualization system 106 also leverages digital-to-physical coordinate system mapping to display the digital model (or portions thereof) in real-time at viewing orientations relative to the physical space. As discussed in detail below, construction visualization system 106 determines appropriate viewing orientations to display the digital model on a device relative to the physical space based on markers that are mapped to known coordinates in both digital and physical coordinate systems.

Figure 4:
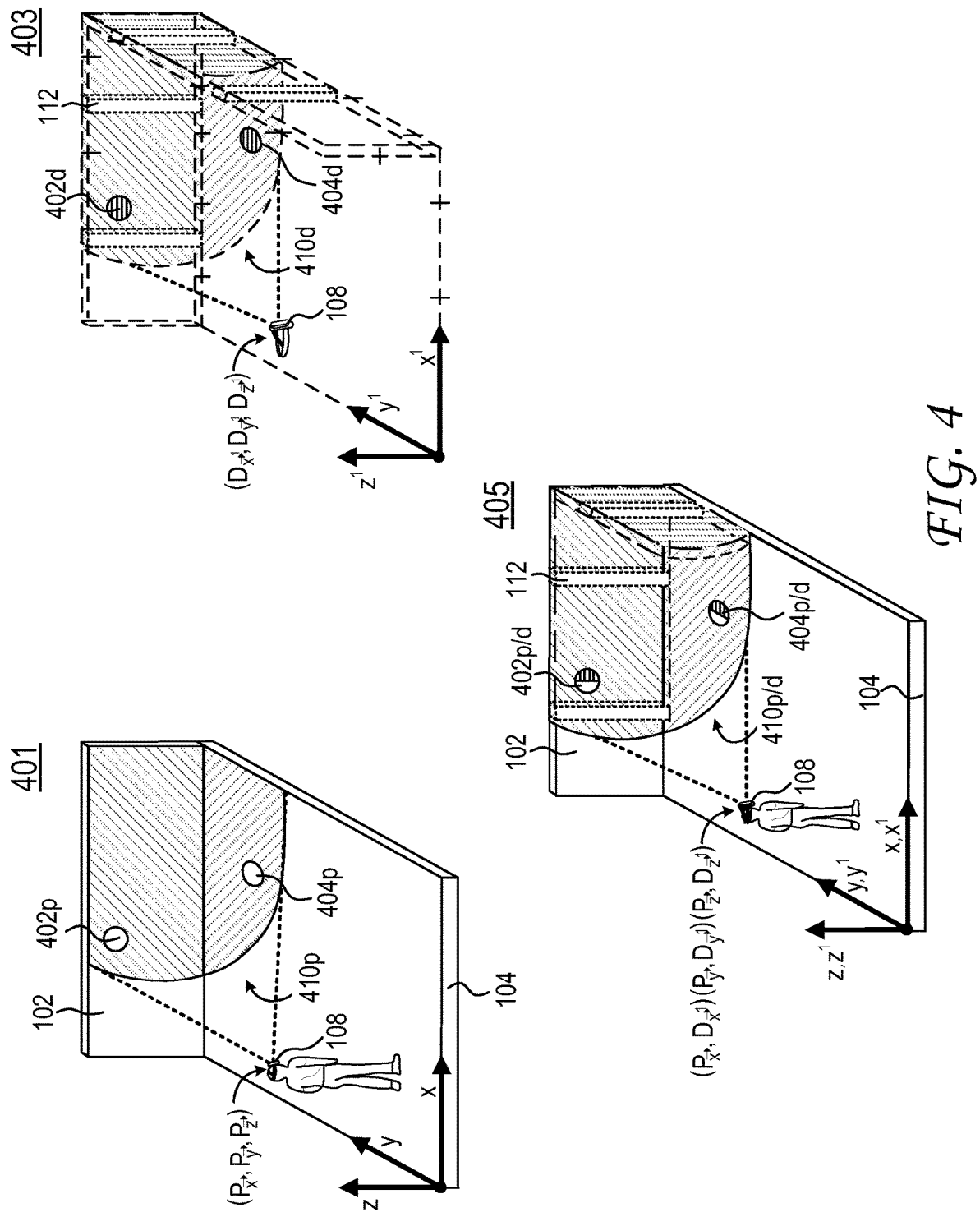
FIG. 4 illustrates a set of schematic diagrams showing construction visualization techniques to determine viewing orientations and display portions of a digital model based on corresponding physical markers and model markers.

FIG. 4 provides a set of schematic diagrams 401, 403, and 405 that collectively illustrate a construction visualization processes to determine viewing orientations of digital model 112 based on markers, and displaying portions of digital model 112 on device 108 relative to the physical space. As mentioned, the construction visualization processes of this disclosure can be performed by construction visualization system 106, one or more devices 108, and/or combinations thereof. In the context of FIG. 4, the construction visualization operations performed by a local device present at the construction site—e.g., a mixed reality headset or device 108.

As shown in diagrams 401-403, digital model 112 represents a meshed digital point cloud model having digital coordinates mapped to the real dimensions or real coordinates of the physical space. Put differently, the dimensions and coordinate points of digital model 112 t reflect the real dimensions of the physical space.

Diagrams 401-403 also illustrate a number of markers, including physical markers 402*p*, 404*p* and corresponding digital model markers 402*d*, 404*d*. As discussed herein, designations of "p" generally correspond to elements in the physical space and designations of "d" generally correspond to elements in the digital space or the digital coordinate system. Elements designated by both "p/d" references generally represent a digital element aligned with or overlapping a corresponding physical element.

Collectively, these markers generally represent control points or anchor points that translate positions between real and digital coordinate systems. These markers help align and constrain viewing planes of digital model 112 relative to the physical space at construction site 104, and orient digital model 112 for display relative to the physical space. Physical markers 402*p*, 404*p* can include unique or distinctive features of the physical space (e.g., corners in a room, doorways, physical structures, etc.), physical objects, and stickers having graphical symbols, patterns, text, 2D codes, QR codes, and so on. Model markers 402*d*, 404*d* include graphical representations in the digital space for corresponding physical markers.

Referring to diagram 401, device 108 has a field of view 410*p* of the physical space. Field of view 410*p* includes portions of structure 102 as well as physical markers 402*p* and 404*p*. In diagram 403, device 108 has a corresponding digital field of view 410*d* that includes portions of digital model 112 and model markers 402*d* and 404*d* in a digital coordinate system. In diagram 405, device 108 has a hybrid field of view 410*p*/410*d* (e.g., hybrid digital/physical field of view) that displays portions of digital model 112 overlaid over the view of the physical space and structure 102. Hybrid field of view 410*p/d* shown in diagram 405 represents a graphical overlay view of portions of digital model 112 displayed relative to the physical space. In other words, device 108 displays graphical representations of digital components (e.g., studs) that will be constructed at the displayed positions relative to respective installation positions in the physical space.

Referring to the diagrams collectively, device 108 operably determines its real and digital positions and orientations in real and digital coordinate systems (e.g., $P\vec{x}$, $P\vec{y}$, $P\vec{z}$, and $D\vec{x}^1$, $D\vec{y}^1$, $D\vec{z}^1$). Device 108 also determines a viewing orientation of digital model 112 for display relative to the physical space by aligning corresponding physical markers and model markers 402*p/d* and 404*p/d*. Device 108 also determines appropriate portions of digital model 112 to display based on field of view(s) 410*p*/410*d*. Device 108 further displays portions of digital model 112 based on the viewing orientation. In some examples, the foregoing processes are optionally performed iteratively in order to continuously update in real-time the viewing orientation of the digital model and display corresponding graphical overlays based on the current position and orientation of device 108—e.g., the graphical overlays of the digital model and corresponding components are updated as device 108 moves around the physical space. In this fashion, device 108 is configured to display relevant portions of digital model 112 and show a real-time overlay of digital model 112 for corresponding portions of the physical space.

In detail, device 108 determines the relevant portion(s) and viewing orientation of digital model 112 for display relative to the physical space based its corresponding physical and digital position and the physical/digital position for corresponding markers—e.g., physical markers 402*p*/404*p* and model markers 402*d*/404*d*. Paired markers provide known control or coordinate points in respective coordinate systems that define a viewing plane for orienting and displaying digital model 112 relative to the physical space.

Referring again to diagram 401, device 108 determines its position and orientation in the real coordinate system ($P\vec{x}$, $P\vec{y}$, $P\vec{z}$). For example, device 108 can be configured to determine its real position and orientation based on image data and triangulation techniques. Device 108 can triangulate its real position based on known real coordinates of the physical markers, positions of the physical markers within images data, and known camera geometry (e.g., image sensor dimensions/focal length).

In another example, device 108 includes position sensors that measure its orientation, velocity, acceleration, and so on. In this example, device 108 initializes at a known real coordinate and orientation (e.g., at and/or near an entry way, a corner, a physical marker, etc.) and subsequently monitors changes from the known real coordinate/orientation (e.g., using position sensors, gyroscopes, accelerometers, etc.), and updates its current real coordinate and orientation based on the same.

Turning to diagram 403, device 108 operably aligns its position and orientation in real coordinate system ($P\vec{x}$, $P\vec{y}$, $P\vec{z}$) with a corresponding position and orientation in the digital coordinate system ($D\vec{x}^1$, $D\vec{y}^1$, $D\vec{z}^1$) based on corresponding pairs of physical/model markers 402*p*/402*d* and 404*p*/404*d*. Notably, each physical marker is positioned at a known real coordinate in the physical space and the real coordinate system. Device 108 generates a corresponding model marker and assigns each model marker to a corresponding digital coordinate in the digital coordinate system. As discussed, device 108 maps and translates coordinate points and positions between the digital coordinate system ($x^1$, $y^1$, $z^1$) and the physical coordinate system (x, y, z) based on a point cloud representation of the physical space. In some examples, device 108 maps digital model 112 to the point cloud representation of the physical space based on at least one model marker and at least one corresponding physical marker. Device 108 can also be configured to mesh, adjust, and/or build digital model 112 according to the points and/or dimensions of the point cloud, which further aligns digital model 112 to the dimensions of the real-world physical space. In this fashion, device 108 aligns the real coordinate system with the digital coordinate system, and converts known coordinate positions of each physical marker into a corresponding model marker in the digital model.

In one example, device 108 initially registers physical markers in the real coordinate system with respective model markers in the digital coordinate system—e.g., physical marker 402*p* registers with model marker 402*d* and physical marker 404*p* registers with model marker 404*d*. In this context, the term register means confirming, syncing, pairing, and/or aligning coordinate positions for respective markers between the coordinate systems. In operation, device 108 renders holographic model markers 402*d*/404*d* on a display interface as an overlay to the physical space. For example, device 108 can include a transparent interface that displays holographic overlay elements and/or device 108 can display real-time images/video of the physical space with overlaid graphical elements. The user moves device 108 and/or manipulates controllers associated with device 108 (e.g., drag/drop controls) to register or sync a displayed model marker with a respective physical markers 402*p*/404*p*. For example, device 108 can display model marker 402*d* over real-time video of the physical space. The user moves or manipulates device 108 to move the displayed model marker 402*d* over a display of the corresponding physical marker 402*p*. When the display shows model marker 402*d* aligned with physical marker 402*p*, the user can click a button on device 108 to register or pair the markers. In some examples, device 108 can automatically detect and register paired markers when corresponding markers are aligned, registered pairs of model/physical markers between the coordinate systems creates anchor points or control points for subsequently aligning viewing orientations of digital model 112 to the physical space.

In some examples, the construction visualization process uses at least two corresponding physical/model markers to orient digital model 112 relative to the physical space. However, it is also appreciated that the construction visualization process can optionally orient digital model 112 relative to the physical space using a single pair of corresponding physical/model markers in conjunction with other position and/or orientation information for device 108. In general, increasing the number of corresponding or paired physical/model markers increases orientation accuracy, efficiency, and response time.

Referring to diagram 405, device 108 determines the portions of digital model 112 to display based on its position, orientation, and the field of view in both digital and physical coordinate systems. As mentioned, device 108 determines its orientation and position relative to the physical space and relative to digital model 112. Here, device 108 determines areas of corresponding fields of view 410*p*/410*d* based on known device configurations, dimensions of image sensors, and/or image boundaries in image data. Device 108 also determines its digital field of view 410*d* covers or overlaps certain portions of digital model 112 based on its position and orientation in the digital coordinate system. Device 108 displays the overlapping portions of digital model 112 in the real-world.

As discussed, device 108 also updates the displayed portions of digital model 112 relative to the physical space based on its movements and changing orientations. In other words, the displayed portions of digital model 112 changes as field of views 410*p*/410*d* change.

As an example, tilting device 108 changes its field of view and its viewing plane of the physical space. Device 108 detects a titling motion and rotates a viewing plane of digital model 112 about an axis in the digital coordinate system ($\vec{x}^1, \vec{y}^1, \vec{z}^1$) to generate a new viewing orientation of digital model 112 that aligns with the tilted viewing plane of the physical space. Generally, device 108 rotates, translates, and/or scales digital viewing planes of digital model 112 as it moves and generates or changes the viewing orientations of digital model 112 to ensure the displayed portions are aligned with the viewing plane in the physical space.

As mentioned, the above construction visualization operations can be performed by device 108, construction visualization system 106, and/or combinations thereof.

Figure 5:
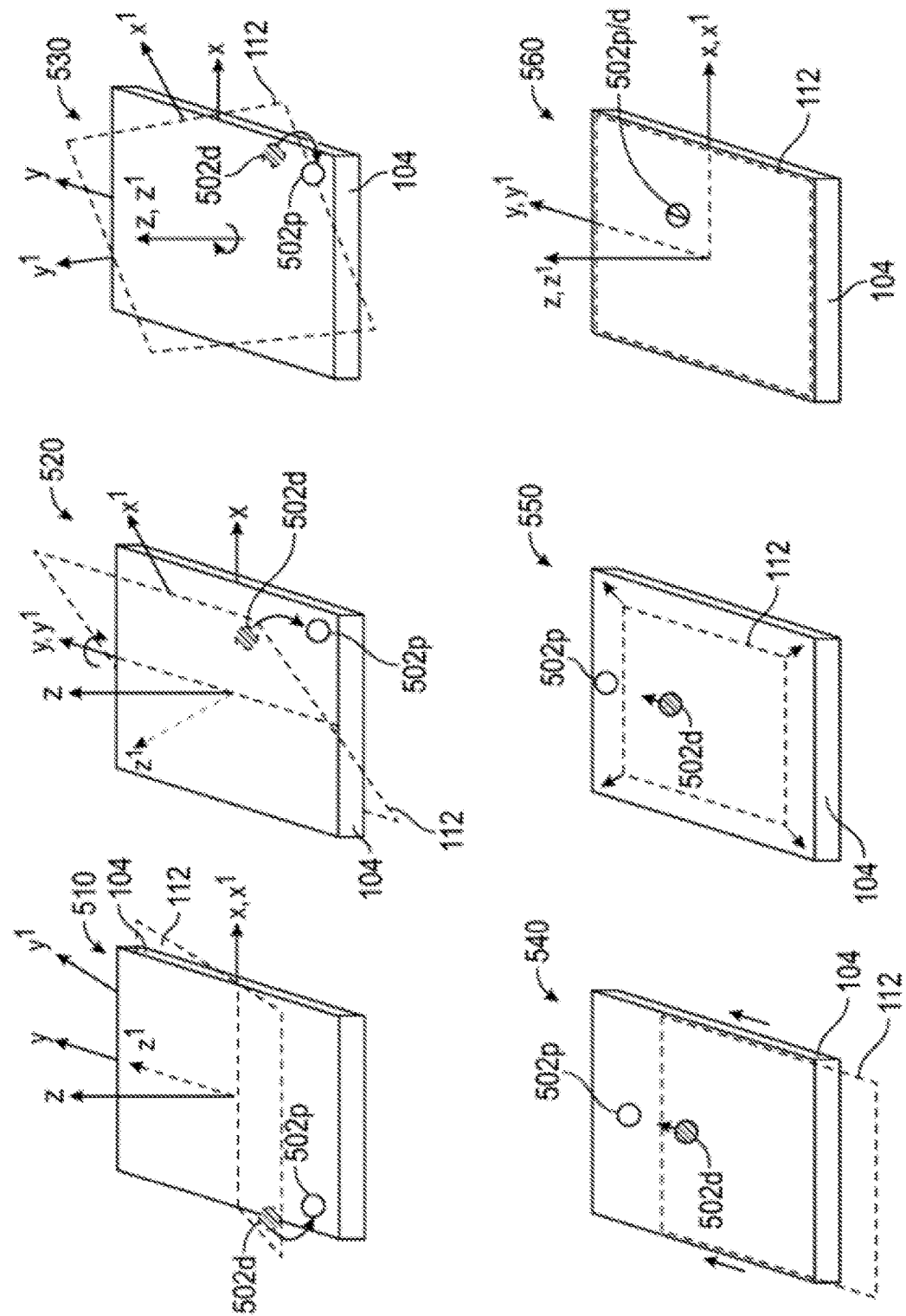
FIG. 5 illustrates a set of schematic diagrams that show example construction visualization techniques to adjust viewing orientations of a digital model relative to a physical space based on corresponding physical markers and model markers.

FIG. 5 illustrates a set of schematic diagrams that show example construction visualization techniques to adjust viewing orientations of digital model 112 relative to the physical space by aligning at model marker 502*d* to a corresponding physical marker 502*p*. For discussion and simplicity, the diagrams in FIG. 5 illustrate orientations of a floor portion of digital model 112 offset relative to a corresponding floor portion of construction site 104.

As discussed, the construction visualization process can update viewing orientations of digital model 112 relative to the physical space and display portions of digital model 112 within overlapping fields of view between the digital and physical spaces and coordinate systems.

In particular, the construction visualization process determines the appropriate viewing orientation of digital model 112 based paired physical/model markers—namely, paired physical/model markers 502*p*/502*d*. The paired physical/model markers define known coordinate positions for respective physical/digital viewing planes. The construction visualization process aligns the digital viewing plane with the physical viewing plane to orient digital model 112 relative to the physical space. For example, the construction visualization process assigns physical markers 502*p* to known coordinates in the real coordinate system (x, y, z) and pairs or registers it with a respective model marker 502*d* in the digital coordinate system ($x^1, y^1, z^1$). The construction visualization process further determines the position and orientation of a device (e.g., device 108) relative to the physical space by analyzing image data that includes one or more physical markers. The construction visualization process also determines the viewing orientation of digital model 112 by rotating, translating, scaling, and/or shifting digital model 112 to align respective paired markers between coordinate systems, which aligns digital model 112 for display relative to the physical space.

Diagrams 510, 520, and 530 show exemplary pitch, roll, and yaw rotations that mitigate offsets between coordinate systems and align model markers 502*d* with physical marker 502*p*. In diagram 510, the construction visualization process rotates digital model 112 about the ($x^1$, x) axes to align the markers between coordinate systems. Similarly, the construction visualization process rotates digital model 112 about the ($y^1$, y) axes in diagram 520, and about the ($z^1$, z) axes in diagram 530.

In diagram 540, the construction visualization process shifts or translates digital model 112 along the $y^1$ axis to mitigate a linear offset between the coordinate systems. It is also appreciated that the construction visualization process can shift or translate digital model 112 along other axes ($x^1$, $z^1$) as appropriate. In diagram 550, the construction visualization process scales or re-dimensions digital model 112 along the $x^1$, $y^1$ axes to mitigate an undersized scale offset relative to x, y axes of the real coordinate system for the physical space. It is also appreciated that in some examples, the construction visualization process can reduce the scale or dimension of digital model 112 to align paired markers and coordinate axes.

In diagram 560, the construction visualization process properly aligns the size and orientation of digital model 112 relative to the physical space or construction site 104. As shown, the construction visualization system aligns the corresponding model marker and physical marker to align the digital/physical coordinate system axes.

Collectively, the rotations, shifts, translations, and/or scaling operations illustrated in FIG. 5 are provided for purposes of example and discussion, not limitation. It is appreciated that the construction visualization process can and does perform combinations of these operations to properly orient and align digital model 112 for display relative to the physical space, and further displays portions of digital model 112 as graphical overlays in real-time images and/or video of the physical space.

Figure 6:
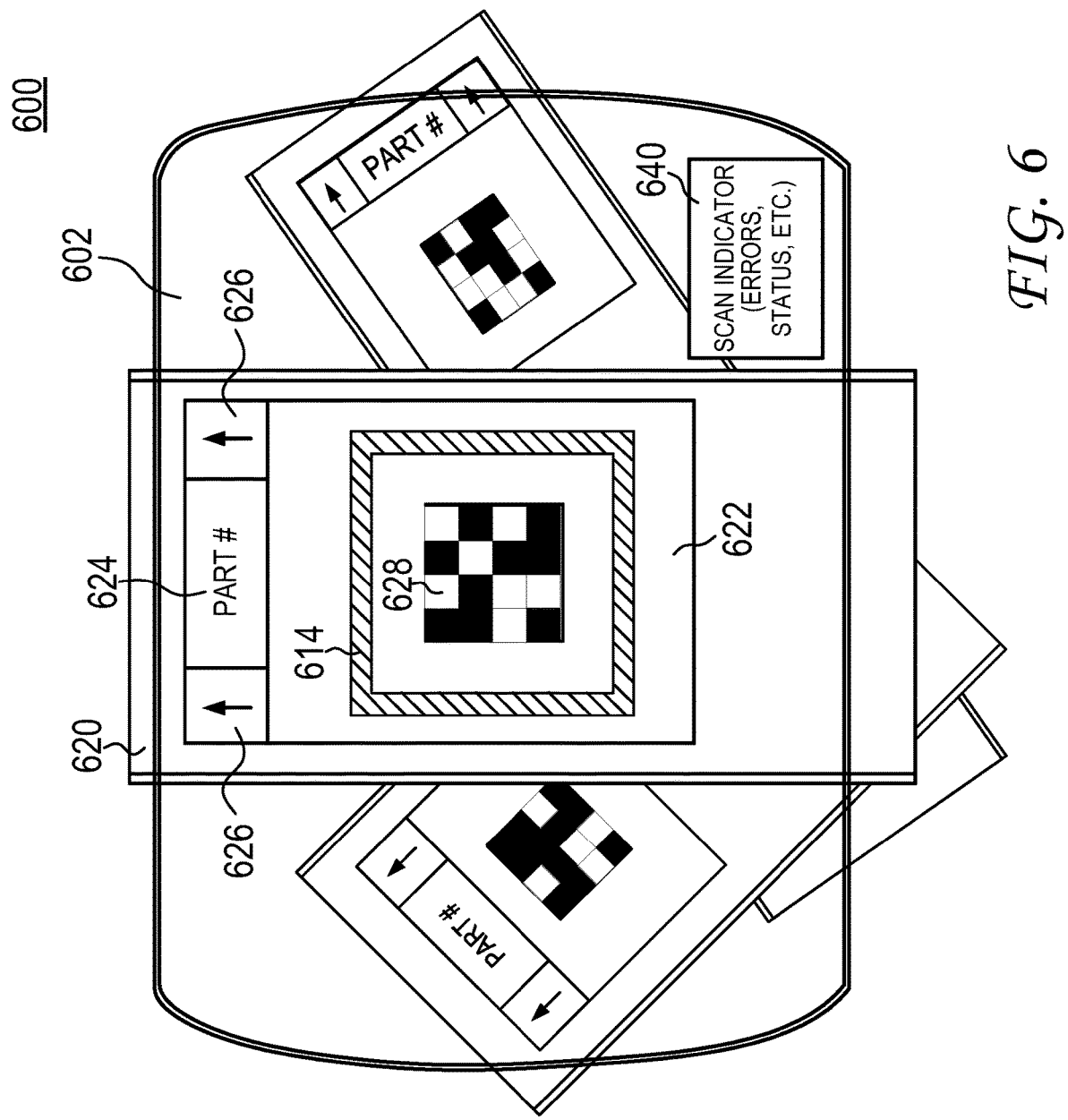
FIG. 6 illustrates a schematic diagram of an example interface of a device employed at the construction site shown in FIG. 1, showing a component scanning mode view.

FIG. 6 illustrates a schematic diagram 600 that shows an example interface 602 of a device employed at a construction site. For example, interface 602 can represent an interface or display for one or more of devices 108 shown in FIG. 1. As illustrated, interface 602 generally represents an interactive display interface that can be configured to display real-time images of the physical space, as well as graphical overlays relative to the physical space. In some examples, interface 602 can be configured to display visual representations of a building model (e.g., digital model 112) as well as installation instructions for component parts of a structure.

As illustrated, interface 602 shows a component scanning mode view for identifying physical parts or components for constructing a structure (e.g., structure 102). Notably, example scanning mode operations performed by the device using interface 602 are described with reference to FIG. 7.

Still referring to diagram 600, the device associated with interface 602 initializes a component scanning mode to identify or scan a component 620 using a graphical scanning or bounding element 614 and determine a location for a corresponding digital component within the building model. As shown, bounding element 614 is a translucent holographic box that a user positions over real-time images of the physical space. Bounding element 614 and serves as a guide to help direct the image scanner/camera of the device over the unique part identifier. It is expressly contemplated that bounding element 614 is not limited to a specific shape (e.g., a box). For example, bounding element 614 can include any number of shapes and/or forms such as rectangles, triangles, circles, partial boxes, hash lines, outlines, and so on.

As shown, there are a number of components visible to interface 602 and/or the camera associated with interface 602. Bounding element 614 operates to identify a specific machine-readable code 628 among multiple machine-readable codes in view. Here, the user aligns bounding element 614 over machine-readable code 628 to indicate the specific component the user intends to select—e.g., component 620. The device determines machine-readable code 628 is inside bounding element 614 by casting a ray from an origin point through bounding element 614 and intersecting with machine-readable code 628. The location of the origin point varies depending on the type of the device—e.g., center of operator's head for a headset mixed reality device, center of tablet for a tablet device, and so on.

Notably, bounding element 614 it is not required in all examples. Optionally, the device can detect unique part identifiers without the bounding element. For example, the device can detect all unique part identifiers visible to the image scanner/camera, the device can detect a hover and hold from a center point corresponding to interface 602, and so on.

The component scanning mode view also includes a graphical scan indicator 640, which provides scanning errors, scanning status, and other relevant scanning mode information. In some examples, interacting with scan indicator 640 can call up a menu that displays scanning status information.

Component 620 is a drywall track, however it is appreciated that component 620 can be any type of construction component part, including prefabricated parts. Component 620 includes a label 622 attached to at least one of its surfaces. Label 622 provides part information such as a part identification code 624, orientation indicators 626 that specify installation direction/orientation, and machine-readable code 628. Orientation indicators 626 can represent part asymmetry and/or directional graphics to facilitate proper installation. Part identification code 624 and/or machine-readable code 628 represent unique identifiers associated with component 620.

As discussed in the FIG. 7 below, the scanning mode operations include looking up corresponding digital components within the building model based on unique identifiers, which can include searching a component list or database of components associated with the building model. While the unique identifiers shown in FIG. 6 are printed on label 622, it is appreciated that component 620 can have other unique identifiers including its size, shape, notches, etchings, and so on. In addition, machine-readable code 628 can include for example, 2D codes, Quick Response (QR) codes, bar codes, an identification, a physical characteristic, and other graphical identifiers associated with component 620.

Figure 7:
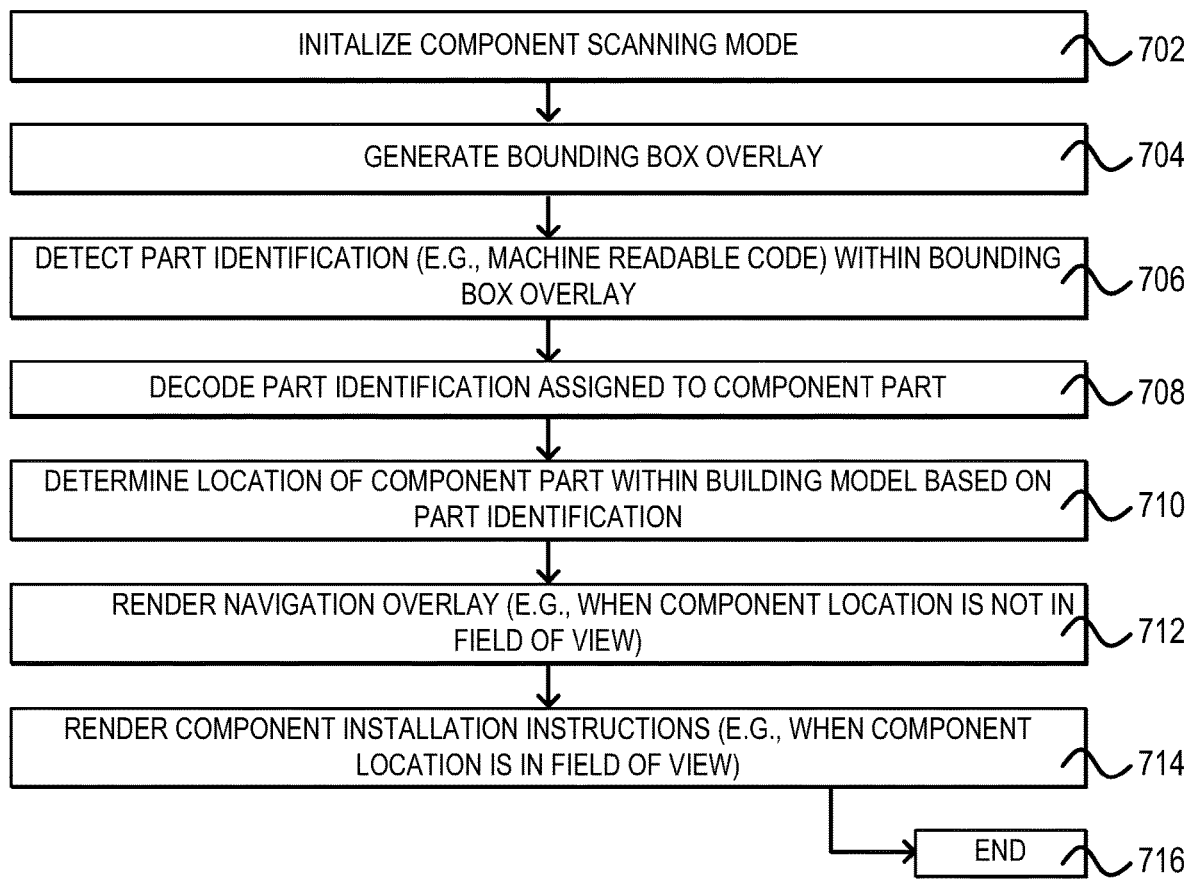
FIG. 7 illustrates an example procedure for component scanning mode operations.

Turning to FIG. 7, procedure 700 describes an example component scanning mode process that can be executed by the device associated with interface 602, discussed above. In some examples, procedure 700 can also be performed by a remote system that communicates with the device associated with interface 602—in a distributed computing environment, as part of a cloud-based or web-hosted platform, etc. For purposes of discussion, the operations of procedure 700 are described in the context of a device and the features associated with interface 602 described above.

Procedure 700 begins at step 702, where the device initializes a component scanning mode. In some examples, the device initializes the component scanning mode in response to a request, which is triggered by a button press, a voice command, audio inputs, gesture sensing, and so on. Optionally, in other examples, the device continuously scans an area for unique identifiers associated with a component using an interrupt schedule.

Procedure 700 continues to step 704, where the device generates and displays bounding element 614 over real-time images of the physical space. In some examples, the device includes mixed reality lenses that display graphical overlays of bounding element 614, as shown in FIG. 6. In these examples, the device detects an eye position of a user and displays bounding element 614 in a position on interface 602 corresponding to the detected eye position. In other examples, the device displays bounding element 614 at a fixed location on interface 602—e.g., the center of the display screen. Still further, the device can generate bounding element 614 based on the user's field of view locks on the user's head motion as part of a head-gaze and dwell operation.

Procedure 700 continues to step 706, where the device detects unique part identifiers associated with a component and within bounding element 614. For example, the device detects part identification code 624, machine-readable code 628 and/or other unique identifiers associated with component 620. The device can detect the unique part identifiers using a camera sensor, which collects image frames of at least the area bounded by bounding element 614. The device can continuously monitor and analyze image data to search and detect unique part identifiers.

In some instances, the device detects machine-readable code 628 within bounding element 614, but the device is not held steady for a required duration of time (e.g., 1 second, 2 seconds, etc.). In such instances, scan indicator 640 displays relevant status information and notifications that mitigate the risk of a false-positive scan, such as "hold machine-readable code within scanning/bounding element for at least 2 seconds" or any other suitable duration of time. Setting a predetermined time to maintain bounding element 614 over a unique part identifier mitigates false positives—e.g., the user may move the device and bounding element 614 over several machine-readable codes en route to a desired component. Although a two second waiting period is described as an example, it should be understood that any time interval can be used, so long as it sufficiently mitigates false-positive scans.

At step 708, the device decodes the unique part identifier into the proper format and context required for matching the physical component to its corresponding digital component in the building model. For example, the device decodes and verifies the unique part identifier for component 620 (e.g., machine-readable code 628 and/or part identification code 624) matches with a digital component in a component list or database associated with the building model. In some cases, the result of decoding the unique identifier does not conform to the format of a valid component identification code. When the device determines the decoded unique identifier in an image frame does not conform a valid component identification code, the device discards the image frame, and analyzes the next image frame for a format-conforming unique identifier corresponding to information for components associated with in the building model. Scan indicator 640 generates notifications about non-conforming machine-readable codes detected in an image frame to indicate an error with the scanning operation.

Procedure 700 continues to step 710, where the device determines a location of the digital component corresponding to component 620 within the building model or digital model. In particular, the device searches the building model for a part identification code 624. In some examples, the building model can include a component list/database associated with the building model. The device formats part identification code 624 as a search term/query, and searches the building model using the search term/query to retrieve building model locations and orientations of the digital component. In addition, the device can retrieve physical characteristics of the component (e.g., length, profile, etc.) in order to display an accurate graphical representation of the component. The device further converts the building model locations and orientations into a real location and orientation in the physical space using the digital-to-physical coordinate system mapping, discussed above. In this fashion, the device can translate digital component positions and orientations from the digital coordinate system into corresponding real component positions and orientations in the real coordinate system.

The device also determines if its current hybrid field of view (ref. FIG. 4) includes the intended location for installing component 620. If the current hybrid field of view does not show the intended location for installing component 620 and/or if the user is too far away from the intended location for installing component 620, the device renders a navigation overlay, shown in step 712. Navigation overlays can include arrows, lead/lines, text, and so on. Navigation overlays generally communicate instructions via interface 602 to help a user navigate from a current position to the installation location for the component.

Once the device is at the installation location, procedure 700 renders component installation instructions at step 714. Here, the device determines if the installation location of the digital component corresponding to component 620 is visible in its hybrid field of view. The device further renders component installation instructions and displays the component installation instructions over a real-time view of the physical space. Component installation instructions can include a visualized or graphical component position and orientation corresponding to the location of the real component 620. Graphical component orientations can include orienting arrows corresponding to an orientation indicator 626 associated with component 620. Orientation indicator 626 can be printed on a label 622 or otherwise indicated on component 620. Orientation indicator 626 provides instructions to correctly orient component 620 based on a graphical component orientation. In some examples, orientation indicator 626 is a unique geometric feature of component 620 that can be used to specify an orientation for the component. The graphical component orientation in the component installation instructions can illustrate the unique geometric feature of the component to instruct an installer how to properly orient the component 620 at the correct component location. The device can also render and display other installation instructions that specify tools, provide relevant building codes, display reference images of exemplary installations, display video sequences of installation steps, and so on.

Procedure 700 subsequently ends at step 716, but it may continue on to step 702 where the device initializes a component scanning mode. While procedure 700 describes an example component scanning mode for scanning any component, it is appreciated that the construction visualization process can include additional steps for selecting components. For example, the construction visualization process can include a predetermined sequence for part selection. Alternatively, the construction visualization process can include pre-packing steps to package and ship parts in a particular order or sequence to minimize the need for scanning component parts.

It should also be noted that each of the steps within procedure 700 may be optional and further, the steps shown in FIG. 7 are provides as examples for illustration—certain other steps may be included or excluded as desired. In addition, while a particular order of the steps is shown, this ordering is merely illustrative, and any suitable arrangement of the steps may be utilized without departing from the scope of the examples herein.

Figure 8:
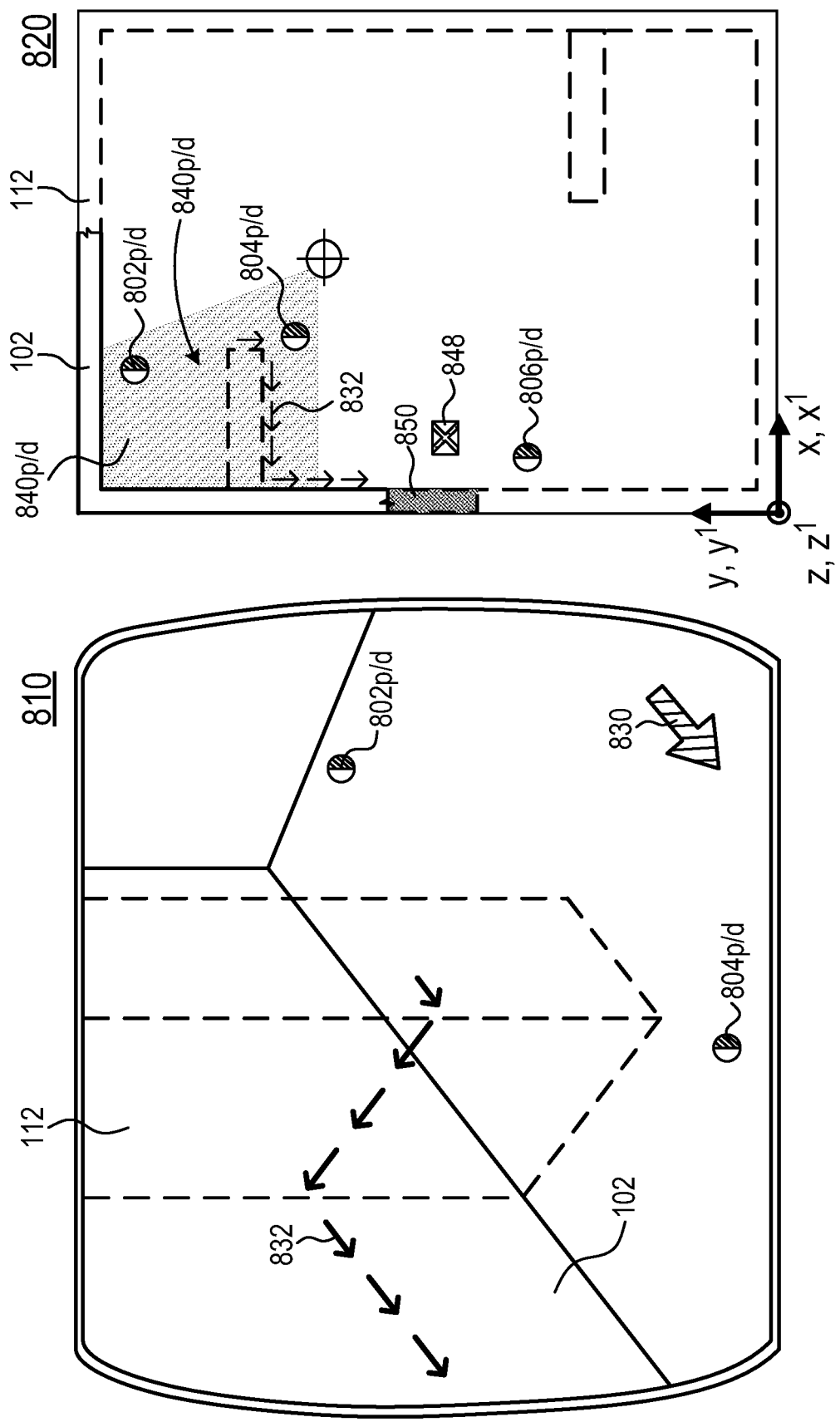
FIG. 8 illustrates a schematic diagram of interfaces associated with a local device at a construction site, showing a first person view of a portion of a digital model displayed relative to the construction site and a top plan view of the digital model of the construction site.
Figure 9:
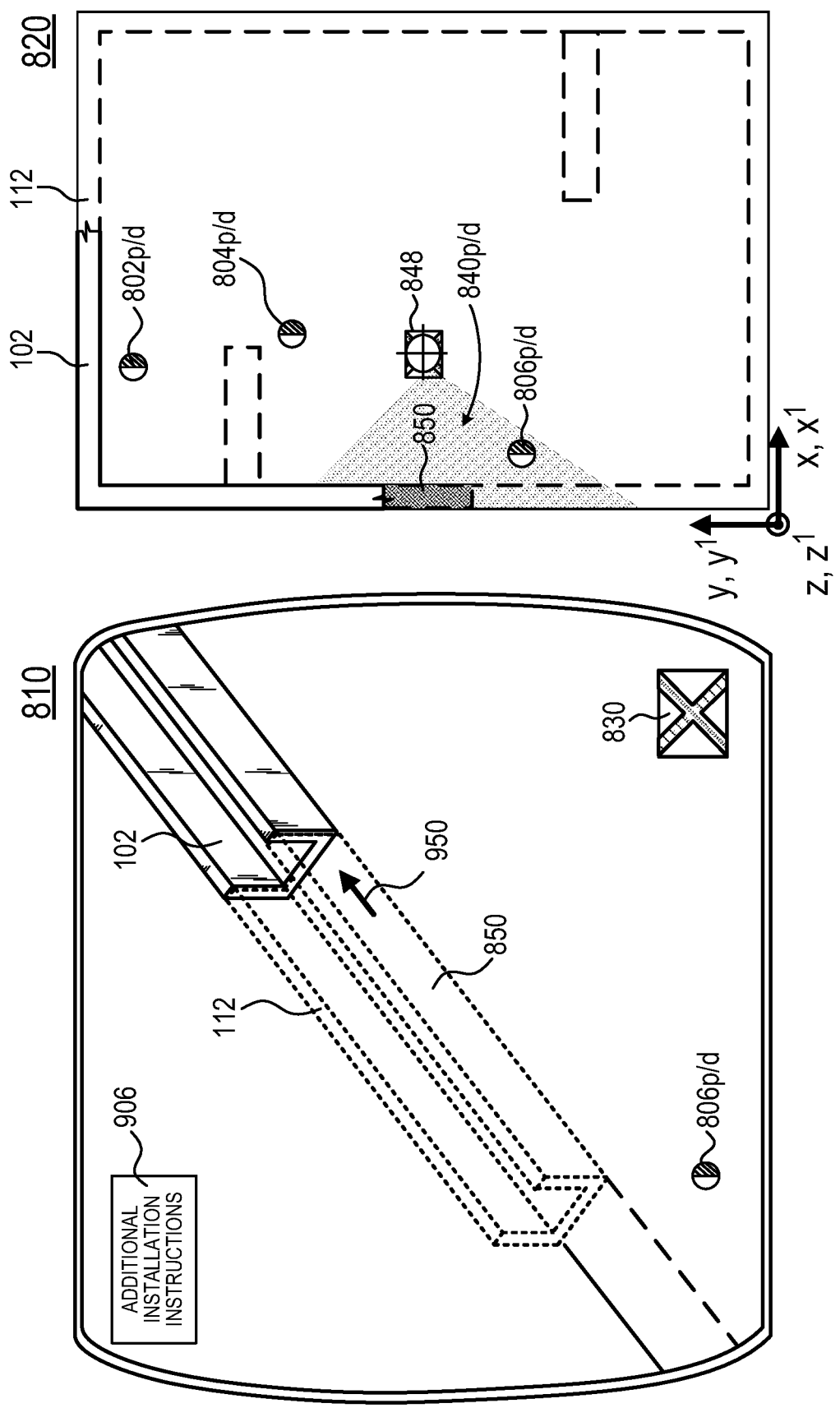
FIG. 9 illustrates a schematic diagram of the interfaces of FIG. 8, further showing a graphical component part of the digital model overlaying a real-time display of the construction site.

FIGS. 8-9 illustrate schematic diagrams of interfaces 810 and 820 associated with a local device at a construction site. Interface 810 generally show a first person view of a portion of digital model 112 and interface 820 shows a top plan view of digital model 112. Interfaces 810 and 820 represent the interfaces of a device (e.g., device 108) present in a physical space and are discussed in this context. It is appreciated that the device can toggle between interface 810 and interface 820, depending on preferences. It is also appreciated that the device can render these interfaces at the same time. For example, the device can display interfaces 810 and 820 side-by-side, picture-in-picture, and so on.

Interfaces 810 and 820 display paired or overlaid model/physical markers, including markers 802p/d, 804p/d, and 806p/d. As discussed, the device determines a viewing orientation of digital model 112 for display relative to the physical space based on these markers. In FIGS. 8-9, the device previously determined the viewing orientation of the digital model and currently displays a view of the digital model aligned with or relative to the real-time position and orientation of the device in the physical space.

Referring to FIG. 8, interface 810 displays a real-time view of the construction site, partially constructed structure 102, and portions of digital model 112 in a graphical overlay view. In other words, interface 810 displays a real-time hybrid field of view of both the physical space and corresponding portions of digital model 112. Here the hybrid field of view displayed by interface 810 corresponds to hybrid field of view 840p/d shown in interface 820.

Interface 810 renders or displays graphical navigation overlays, which include a navigation graphic 830 and a navigation guide line 832. Collectively, the graphical navigation overlays provide navigation instructions that guide, aid, or otherwise instruct a user to move toward a location in the physical space for a corresponding physical part. Here, navigation graphic 830 includes an arrow indicating a direction to turn and move the device toward an installation location for the physical part. As shown in interface 820, the installation location is designated by a location graphic 848 and the corresponding physical part is designated by component 850. Referring again to interface 810, navigation guide line 832 provides a graphical navigation path to guide the device toward the location. Interface 810 displays graphical navigation overlays in FIG. 8 because component 850 and its location are outside of its field of view. Interface 810 can also display graphical navigation overlays when the installation location is within its field of view when, for example, the device is far away.

Interface 820 illustrates a top plan view of digital model 112 overlaid on construction site 104. As mentioned, interface 820 displays the location for component 850 as well as the current position and orientation of the device in the corresponding real and digital coordinate systems—e.g., (P$\vec{x}$, D$\vec{x}^1$), (P$\vec{y}$, D$\vec{y}^1$), (P$\vec{z}$, D$\vec{z}^1$). Interface 820 also displays navigation guide line 832 to help the user navigate or move toward location 848 for component 850.

Referring to FIG. 9, the device navigated to the location corresponding to component 850 and the device is currently viewing the position to install component 850 in structure 102. Interface 810 displays a graphical representation of component part 850 because the device is proximate to its installation location and within its field of view. Notably, component 850 is part of and/or associated with digital model 112—e.g., component 850 may be included within a part list or a database of parts associated with digital model 112.

Interface 810 further renders or displays instructions for installing component 850. As shown, the instructions include a visual presentation or graphical display of component 850, which shows its geometric or structural features, installation orientation, and/or installation location. Here, the instructions can include a graphical orienting arrow 950, which may correspond to orientation arrows included on its label. In this way, the graphical instructions show and teach proper installation of the physical part relative to physical space or structure 102.

Interface 810 also displays an interactive graphical icon 906 for displaying additional installation instructions. The additional installation instructions can specify tools required, relevant building codes, reference images or video of exemplary component installations, views of the component in an installed configuration, and so on.

Collectively, interfaces 810 and 820 in FIGS. 8-9 provide example graphics, overlay views, graphical elements, navigation guides, and instructions that are rendered by a device at a construction site in real-time and relative to the position and orientation of the device. The various graphics shown in interfaces 810 and 820 minimizes installation errors by displaying the correct installation position and orientation of component parts in the physical space.

It is also appreciated that the graphics illustrated and described above are exemplary and are not limited to the context of installation. In some examples, the device can generate graphics of component parts for post-construction inspection. In these examples, the overlay views of digital model 112 display digital representations of component parts based on approved or certified building plans, building codes, and/or other regulations. Here, interfaces 810 and 820 can provide an inspector graphical references that show proper component installation relative to the physical space.

Figure 10:
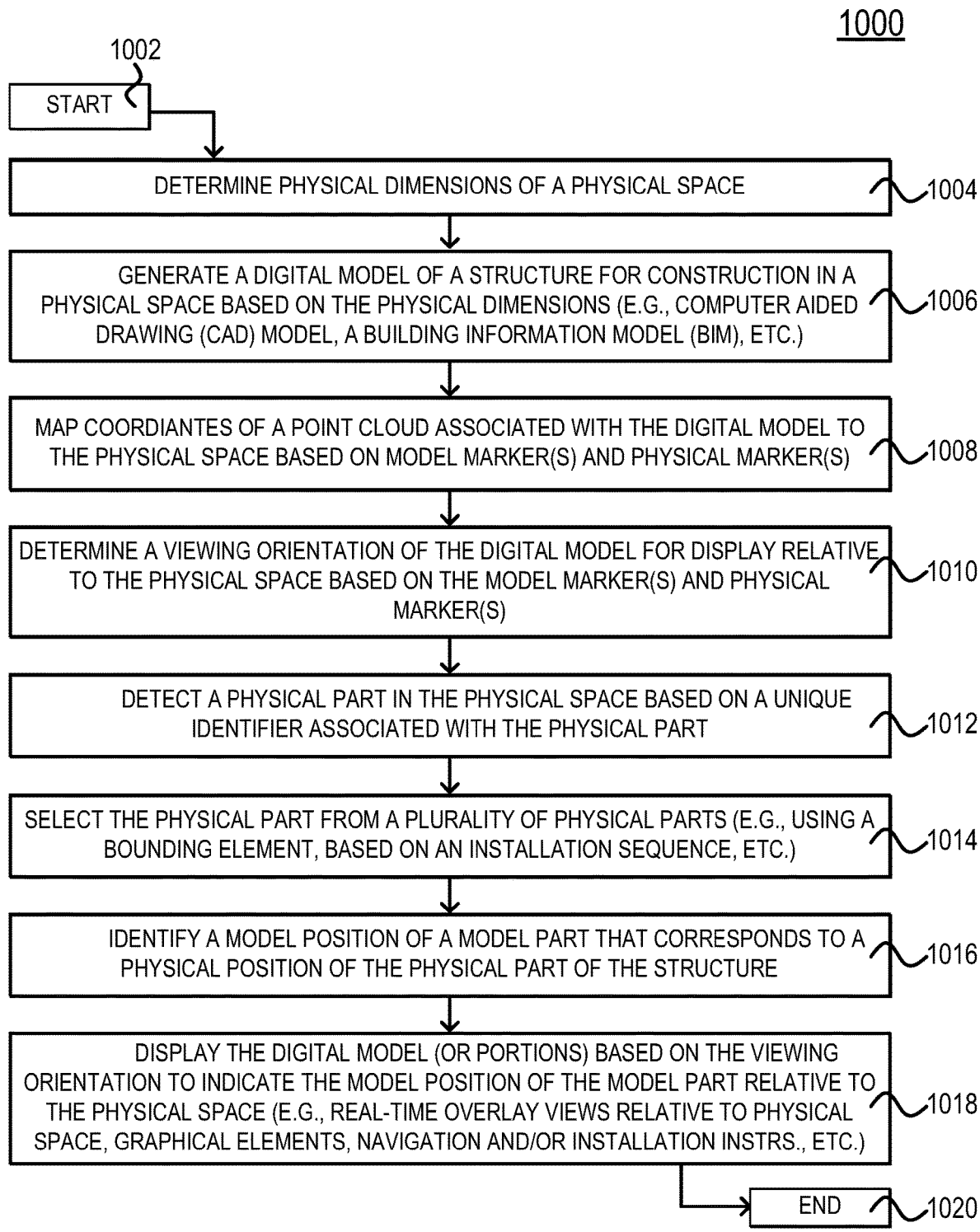
FIG. 10 illustrates an example simplified procedure for a construction visualization process.

FIG. 10 illustrates an example simplified procedure 1000 of a construction visualization process in accordance with one or more examples of this disclosure. For purposes of discussion, procedure 1000 is described in the context of a system, which can include construction visualization system 106. However it is also appreciated that procedure 1000 can be readily adapted or configured to execute on a local device present at a construction site (e.g., devices 108 and/or device 200), and or by combinations thereof.

Procedure 1000 starts at step 1002, and continues to step 1004, where, as described in greater detail above, the system determines physical dimensions of a physical space (e.g., a construction site). As discussed above, the system can employ a laser scanner to scan the physical space and capture data representing its dimensions. Alternatively, the system can receive manually entered measurements of the dimensions.

The system further generates, in step 1006, a digital model of a structure for construction in the physical space based on the physical dimensions. Notably, the digital model can include a Computer Aided Drawing (CAD) model, a Building Information Model (BIM), and so on. In addition, the digital model includes one or more digital model markers, which corresponds to one or more physical marker in the physical space.

In step 1008, the system maps coordinates of a point cloud associated with the digital model to the physical space based on the model markers and physical markers. As described above, the system analyzes and aligns or maps digital and physical coordinate systems between the digital model and the real or physical space using a collection of data points or a point cloud. For example, the system typically assigns or maps a point cloud coordinate position for at least one model marker to a known real coordinate of a corresponding a physical marker in the physical space. Notably, the physical marker can include unique or distinctive features of the physical space, physical objects, stickers, labels, and so on. In some examples, the system adjusts the digital model based on the point cloud. In these examples, the digital model is translated, rotated, scaled, or re-dimensioned to align model markers with corresponding physical markers between coordinate systems.

The system also determines a viewing orientation of the digital model for display relative to the physical space in step 1010. For example, the system determines the viewing orientation based on the at least one model marker and the at least one physical marker. As discussed above, the system determines a position, orientation, and field of view associated with a device (e.g., device 108). The system also determines the viewing orientation of the digital model for display based on the orientation and/or position of a device relative to a physical marker.

Optionally, the system determines relevant portion(s) and viewing orientation of the digital model to display on the device based on the velocity of the device relative to a physical marker, or an acceleration of the device relative to the physical marker. In some examples, the system uses two or more physical markers to determine a viewing orientation of the digital model. In some examples, the system can determine the viewing orientation by rotating, translating, and/or scaling the digital model to align at least one digital model marker with physical markers in the physical space. For example, the system aligns the digital model to a point cloud that represents the dimensions of physical space. In particular, the point cloud includes a point representing a known coordinate for a physical marker in the physical space. The system aligns the digital model to the point cloud by mapping a coordinate position of at least one model marker that corresponds to the point representing the physical marker.

The system can optionally detect, in step 1012, a physical part in the physical space based on a unique identifier associated with the physical part. As described above, the system can perform scanning mode operations, where the system detects a component part by scanning or detecting its unique identifier. Each component party is associated with at least one unique identifier, which can include a 2D code, a Quick Response (QR) code, a bar code, an identification number, or a physical characteristic (e.g., a size or shape of the component part).

Procedure 1000 continues on to step 1014, where the system optionally selects the physical part from a plurality of physical parts. In some examples, the system generates and displays a graphical bounding element and further detects the unique identifier within the bounding element. In other examples, the system selects the physical part based on an installation sequence, where the system references a predetermined installation sequence of component parts, selects physical parts, and provides instructions to identify the selected parts to a user.

The system further identifies a model position of a model part that corresponds to a physical position of a physical part of the structure in step 1016. Here, the system can search a digital model and/or a digital database associated with the digital model based on a part identification code associated with the physical part. The search can return information regarding an installation position and orientation of the part specified within the digital model.

In step 1018, the system displays at least a portion of the digital model based on the viewing orientation to indicate the model position of the model part relative to the physical space (e.g., a real-time overlay view relative to physical space, graphical elements, installation instructions, etc.). As described above, the system can indicate the model position of the model part by displaying overlay views of the digital model rendered over real-time views of the physical space. When the viewing orientation of the digital model displayed on a device includes the portion of the digital model that contains the model position of the model part (e.g., as in FIG. 9), the system displays at least one graphical element that represents an installation instruction of the physical part relative to the structure in the physical space (e.g., an installation position, an installation orientation, or additional installation instructions associated with the physical part). In addition, the system can optionally display any number of additional graphical elements that provide navigation instructions to move or guide the user to a location in the physical space corresponding to the physical part.

Procedure 1000 subsequently ends at step 1020, but may continue on to step 1004 where, as discussed above, the system measures physical dimensions of a physical space. In some examples, procedure can return to other steps such as step 1012, where the system can continuously determine or update the viewing orientation of the digital model relative to the physical space (e.g., if the device moves and the viewing orientation of the digital model has to be updated in response to the movement). It should be noted that certain steps within procedure 1000 may be optional, and further, the steps shown in FIG. 10 are merely examples for illustration—certain other steps may be included or excluded as desired. Further, while a particular order of the steps is shown, this ordering is merely illustrative, and any suitable arrangement of the steps may be utilized without departing from the scope of the examples herein.

The described methods, processes, operations, and associated actions may also be performed in various orders in addition to the order described in this application, in parallel, and/or simultaneously. The described systems are exemplary in nature, and may include additional elements and/or omit elements. Furthermore, references to or "one example" of the present disclosure are not intended to be interpreted as excluding the existence of additional embodiments that also incorporate the recited features. It will be understood that when a certain part or process "includes" a certain component or operation, that part or process does not exclude another component or operation.

The techniques described herein, therefore, describe comprehensive construction visualization processes for generating and displaying an accurate digital model (or portions thereof) relative to a physical space. For example, these techniques visualize and display relevant portions of a digital model and update its viewing orientation in real-time based on device movement. In some examples, the techniques further display real-time navigation graphics, installation instructions, relevant building codes, and so on. Thus, the disclosed construction visualization techniques provide greater installation accuracy, repeatability, and efficiency, and facilitate efficient construction using visual graphics that show real-time proper component part installation, orientation, and location in a physical space. In addition, the construction visualization processes creates accurate digital models that advantageously mitigate errors caused by on onsite design changes, adjustments, and plan revisions.

While there have been shown and described illustrative examples of the construction visualization process, systems, devices, and the like, it is to be understood that various other adaptations and modifications may be made within the spirit and the scope of the examples herein. For example, the examples have been shown and described herein with respect to specific systems and/or devices, however it is appreciated that the construction visualization process in a broader context is operable to provide graphics and overlay views relative to the physical space and for display by any type of device. Additionally, it is appreciated that while specific graphics are shown and described, such graphics are illustrative and exemplary and are not intended to limit the scope of this disclosure. Finally, it is appreciated that while the construction visualization process has been described in the context of unfinished or partially finished construction, it is appreciated that the construction visualization process can be employed to facilitate construction in completely finished environments (e.g., remodeling a house, room, etc.).

The foregoing description has been directed to specific examples. It will be apparent, however, that other variations and modifications may be made to the described examples, with the attainment of some or all of their advantages. For instance, it is expressly contemplated that the components and/or elements described herein can be implemented as software being stored on a tangible (non-transitory) computer-readable medium, devices, and memories (e.g., disks/CDs/RAM/EEPROM/etc.) having program instructions executing on a computer, hardware, firmware, or a combination thereof. Further, methods describing the various functions and techniques described herein can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on. In addition, devices implementing methods according to these disclosures can comprise hardware, firmware and/or software, and can take any of a variety of form factors. Typical examples of such form factors include laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example. Instructions, media for conveying such instructions, computing resources for executing them, and other structures for supporting such computing resources are means for providing the functions described in these disclosures. Accordingly, this description is to be taken only by way of example and not to otherwise limit the scope of the examples herein. Therefore, it is the object of the appended claims to cover all such variations and modifications as come within the true spirit and scope of the examples herein.

The description of the disclosure is provided to enable a person skilled in the art to make or use the disclosure. Various modifications to the disclosure will be readily apparent to those skilled in the art, and the generic principles defined herein may be applied to other variations without departing from the spirit or scope of the disclosure. Throughout this disclosure the term "example" or "exemplary" indicates an example or instance and does not imply or require any preference for the noted example. Thus, the disclosure is not to be limited to the examples and designs described herein but is to be accorded the widest scope consistent with the principles and novel features disclosed herein.

Illustrative Aspects of this Disclosure Include:

Statement 1. A method that includes operations for generating a digital model of a structure for construction in a physical space. Notably, the digital model includes at least one model marker, and the physical space including at least one physical marker. The method also includes operations for determining a viewing orientation of the digital model for display relative to the physical space based on the at least one model marker and the at least one physical marker; identifying a model position of a model part that corresponds to a physical position of a physical part of the structure; and displaying at least a portion of the digital model based on the viewing orientation to indicate the model position of the model part relative to the physical space.

Statement 2. The method of statement 1, wherein determining the viewing orientation further comprises aligning the viewing orientation of the digital model relative to the physical space based on at least one of a position of a device relative to the at least one physical marker or an orientation of the device relative to the at least one physical marker.

Statement 3. The method of any one of statements 1-2, wherein determining the viewing orientation further comprises determining the viewing orientation of the digital model based on at least one of an orientation of a device relative to the at least one physical marker, a position of the device relative to the at least one physical marker, an acceleration of the device relative to the at least one physical marker, or a velocity of the device relative to the at least one physical marker.

Statement 4. The method any one of statements 1-3, wherein displaying the at least the portion of the digital model further comprises: displaying an overlay view of the at least the portion of the digital model relative to a real-time view of the physical space.

Statement 5. The method any one of statements 1-4, wherein displaying the at least the portion of the digital model further comprises: displaying at least one graphical element that represents an installation instruction of the at least one physical part relative to the structure in the physical space.

Statement 6. The method of any one of statements 1-5, further comprising: detecting the physical part in the physical space based on a unique identifier associated with the physical part, wherein the unique identifier includes at least one of a 2D code, a Quick Response (QR) code, a bar code, an identification number, or a physical characteristic of the physical part.

Statement 7. The method of any one of statements 1-6, further comprising: generating a bounding for display by a device; detecting a unique identifier associated with the physical part within the bounding element; and selecting the physical part from a plurality of physical parts in a field of view of the device based on the unique identifier detected within the bounding element.

Statement 8. The method of any one of statements 1-7, wherein generating the digital model of the structure further comprises: determining one or more physical dimensions of the physical space; and adjusting one or more digital coordinates associated with the digital model based on the one or more physical dimensions.

Statement 9. The method of any one of statements 1-8, wherein the at least one model marker comprises two or more model markers, wherein the at least one physical marker comprises two or more physical markers.

Statement 10. The method of any one of statements 1-9, wherein the digital model includes at least one of a Computer Aided Drawing (CAD) model or a Building Information Model (BIM).

Statement 11. An apparatus comprising a processor configured to execute one or more processes, and memory configured to store a process executable by the processor. The process, when executed, is operable to perform operations according to any of statements 1-10.

Statement 12. A non-transitory, computer-readable medium storing instructions encoded thereon. The instructions, when executed by one or more processors, cause the one or more processors to perform operations according to any of statements 1-10.

Additional aspects of this disclosure are set out in the independent claims and preferred features are set out in the dependent claims. Features of one aspect may be applied to each aspect alone or in combination with other aspects. In addition, while certain operations in the claims are provided in a particular order, it is appreciated that such order is not required unless the context otherwise indicates.

The invention claimed is:

1. A method, comprising:
generating a digital model of a structure for construction in a physical space, the digital model including at least one model marker, the physical space including at least one physical marker;
determining a viewing orientation of the digital model for display relative to the physical space based on the at least one model marker and the at least one physical marker;
identifying a model position of a model part that corresponds to a physical position of a physical part of the structure;
displaying at least a portion of the digital model based on the viewing orientation to indicate the model position of the model part relative to the physical space; and
displaying one or more graphical elements that represent at least one of an installation instruction of the physical part relative to the structure in the physical space, or a navigation instruction to move to a location in the physical space that corresponds to the physical part.

2. The method of claim 1, wherein determining the viewing orientation further comprises:
aligning the viewing orientation of the digital model relative to the physical space based on at least one of a position of a device relative to the at least one physical marker or an orientation of the device relative to the at least one physical marker.

3. The method of claim 1, wherein determining the viewing orientation further comprises determining the viewing orientation of the digital model based on at least one of an orientation of a device relative to the at least one physical marker, a position of the device relative to the at least one physical marker, an acceleration of the device relative to the at least one physical marker, or a velocity of the device relative to the at least one physical marker.

4. The method of claim 1, wherein displaying the at least the portion of the digital model further comprises:
displaying an overlay view of the at least the portion of the digital model relative to a real-time view of the physical space.

5. The method of claim 1, further comprising:
detecting the physical part in the physical space based on a unique identifier associated with the physical part, wherein the unique identifier includes at least one of a 2D code, a Quick Response (QR) code, a bar code, an identification number, or a physical characteristic of the physical part.

6. The method of claim 1, further comprising:
generating a bounding element for display by a device;
detecting a unique identifier associated with the physical part within the bounding element; and
selecting the physical part from a plurality of physical parts in a field of view of the device based on the unique identifier detected within the bounding element.

7. The method of claim 1, wherein the at least one model marker comprises two or more model markers, and wherein the at least one physical marker comprises two or more physical markers.

8. An apparatus, comprising:
a processor configured to execute one or more processes; and
memory configured to store a process executable by the processor, the process, when executed, is operable to:
generate a digital model of a structure for construction in a physical space, the digital model including at least one model marker, the physical space including at least one physical marker;
determine a viewing orientation of the digital model for display relative to the physical space based on the at least one model marker and the at least one physical marker;
identify a model position of a model part that corresponds to a physical position of a physical part of the structure;
display at least a portion of the digital model based on the viewing orientation to indicate the model position of the model part; and
display one or more graphical elements that represent at least one of an installation instruction of the physical part relative to the structure in the physical space, or a navigation instruction to move to a location in the physical space that corresponds to the physical part.

9. The apparatus of claim 8, wherein the process to determine the viewing orientation of the digital model is further operable to:
align the viewing orientation of the digital model relative to the physical space based on at least one of a position of a device relative to the at least one physical marker or an orientation of the device relative to the at least one physical marker.

10. The apparatus of claim 8, wherein the process to determine the viewing orientation of the digital model is further operable to determine the viewing orientation of the digital model based on at least one of an orientation of a device relative to the at least one physical marker, a position of the device relative to the at least one physical marker, an acceleration of the device relative to the at least one physical marker, or a velocity of the device relative to the at least one physical marker.

11. The apparatus of claim 8, wherein the process to display at least the portion of the digital model is further operable to:
display an overlay view of the at least the portion of the digital model relative to a real-time view of the physical space.

12. The apparatus of claim 8, wherein the process is further operable to:
detect the physical part in the physical space based on a unique identifier, wherein the unique identifier includes at least one of a 2D code, a Quick Response (QR) code, a bar code, an identification number, a size of the physical part, or a shape of the physical part.

13. The apparatus of claim 8, wherein the process is further operable to:
generate a bounding element for display by a device;
detect a unique identifier associated with the physical part within the bounding element; and
select the physical part from a plurality of physical parts in a field of view of the device based on the unique identifier detected within the bounding element.

14. A tangible, non-transitory, computer-readable medium having instructions encoded thereon, the instructions, when executed by a processor, are operable to:
generate a digital model of a structure for construction in a physical space, the digital model including at least one model marker, the physical space including at least one physical marker;
determine a viewing orientation of the digital model for display relative to the physical space based on the at least one model marker and the at least one physical marker;
identify a model position of a model part that corresponds to a physical position of a physical part of the structure;
display at least a portion of the digital model based on the viewing orientation to indicate the model position of the model part relative to the physical space; and
display one or more graphical elements that represent at least one of an installation instruction of the physical part relative to the structure in the physical space, or a navigation instruction to move to a location in the physical space for installation of the physical part.

15. The tangible, non-transitory, computer-readable medium of claim 14, wherein the instructions to determine the viewing orientation are further operable to:
align the viewing orientation of the digital model relative to the physical space based on at least one of a position of a device relative to the at least one physical marker or an orientation of the device relative to the at least one physical marker.

16. The tangible, non-transitory, computer-readable medium of claim 14, wherein the instructions are further operable to:
detect the physical part in the physical space based on a unique identifier, wherein the unique identifier includes at least one of a 2D code, a Quick Response (QR) code, a bar code, an identification number, a size of the physical part, or a shape of the physical part.

17. The tangible, non-transitory, computer-readable medium of claim 14, wherein the instructions are further operable to:
generate a bounding element for display by a device;
detect a unique identifier associated with the physical part within the bounding element; and
select the physical part from a plurality of physical parts in a field of view of the device based on the unique identifier detected within the bounding element.

18. A method, comprising:
generating a digital model of a structure for construction in a physical space, the digital model including at least one model marker, the physical space including at least one physical marker;
determining a viewing orientation of the digital model for display relative to the physical space based on the at least one model marker and the at least one physical marker;
generating a bounding element for display by a device;
detecting a unique identifier associated with a physical part of the structure within the bounding element;
selecting the physical part from a plurality of physical parts in a field of view of the device based on the unique identifier;
identifying a model position of a model part that corresponds to a physical position of the physical part; and
displaying at least a portion of the digital model based on the viewing orientation to indicate the model position of the model part relative to the physical space.

19. A method, comprising:
generating a digital model of a structure for construction in a physical space, the digital model including two or more model markers, the physical space including two or more physical markers;
determining a viewing orientation of the digital model for display relative to the physical space based on the two or more model markers and the two or more physical markers;
identifying a model position of a model part that corresponds to a physical position of a physical part of the structure; and
displaying at least a portion of the digital model based on the viewing orientation to indicate the model position of the model part relative to the physical space.

20. An apparatus, comprising:
a processor configured to execute one or more processes; and
memory configured to store a process executable by the processor, the process, when executed, is operable to:
generate a digital model of a structure for construction in a physical space, the digital model including at least one model marker, the physical space including at least one physical marker;
determine a viewing orientation of the digital model for display relative to the physical space based on the at least one model marker and the at least one physical marker;
generate a bounding element for display by a device;
detect a unique identifier associated with a physical part of the structure within the bounding element;
select the physical part from a plurality of physical parts in a field of view of the device based on the unique identifier;
identify a model position of a model part that corresponds to a physical position of the physical part; and
display at least a portion of the digital model based on the viewing orientation to indicate the model position of the model part.

21. A tangible, non-transitory, computer-readable medium having instructions encoded thereon, the instructions, when executed by a processor, are operable to:
generate a digital model of a structure for construction in a physical space, the digital model including at least one model marker, the physical space including at least one physical marker;
determine a viewing orientation of the digital model for display relative to the physical space based on the at least one model marker and the at least one physical marker;
generate a bounding element for display by a device;
detect a unique identifier associated with a physical part of the structure within the bounding element;
select the physical part from a plurality of physical parts in a field of view of the device based on the unique identifier;

identify a model position of a model part that corresponds to a physical position of a physical part of the structure; and display at least a portion of the digital model based on the viewing orientation to indicate the model position of the model part relative to the physical space.

\* \* \* \* \*